(12) United States Patent  
Kato et al.

(10) Patent No.: US 8,583,043 B2
(45) Date of Patent: Nov. 12, 2013

(54) HIGH-FREQUENCY DEVICE AND WIRELESS IC DEVICE

(75) Inventors: Noboru Kato, Takatsuki (JP); Nobuo Ikemoto, Moriyama (JP); Yuya Dokai, Kyoto (JP); Koji Shiroki, Muko (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 204 days.

(21) Appl. No.: 13/094,928

(22) Filed: Apr. 27, 2011

(65) Prior Publication Data

US 2011/0199713 A1    Aug. 18, 2011

Related U.S. Application Data

(63) Continuation of application No. PCT/JP2009/070617, filed on Dec. 9, 2009.

(30) Foreign Application Priority Data

Jan. 16, 2009  (JP) ................... 2009-007255

(51) Int. Cl.
*H04B 7/00*  (2006.01)

(52) U.S. Cl.
USPC ............. 455/41.2; 455/41.1; 455/78; 455/80; 455/117; 455/217; 455/289; 455/291; 455/292; 361/736; 361/737; 361/764; 361/767; 361/783

(58) Field of Classification Search
USPC ........... 455/39, 40, 41.1, 41.2, 117, 217, 289, 455/291, 292, 78, 80; 361/736, 737, 764, 361/767, 783; 343/700 R, 700 MS, 869, 870, 343/871
See application file for complete search history.

(56) References Cited

U.S. PATENT DOCUMENTS

| | | | |
|---|---|---|---|
| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |

(Continued)

FOREIGN PATENT DOCUMENTS

| | | |
|---|---|---|
| CN | 101351924 A | 1/2009 |
| CN | 101568934 A | 10/2009 |

(Continued)

OTHER PUBLICATIONS

Official communication issued in Japanese Application No. 2007-531524, mailed on Sep. 11, 2007.

(Continued)

*Primary Examiner* — Tuan A Tran
(74) *Attorney, Agent, or Firm* — Keating & Bennett, LLP (57) ABSTRACT

A high-frequency device includes a wireless IC chip and a board which is coupled to the wireless IC chip and electrically connected to radiator plates, and an inductor and/or a capacitance are provided as a static electricity countermeasure element in the board. The inductor is connected in parallel between the wireless IC chip and the radiator plates, and its impedance at the frequency of static electricity is less than an impedance of the wireless IC chip.

13 Claims, 7 Drawing Sheets

(56) References Cited

U.S. PATENT DOCUMENTS

| | | | |
|---|---|---|---|
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,611 A | 8/2000 | Glover et al. |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,856,788 B2 * | 2/2005 | Chang et al. ............... 455/41.1 |
| 6,861,731 B2 | 3/2005 | Buijsman et al. |
| 6,927,738 B2 | 8/2005 | Senba et al. |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 7,519,328 B2 * | 4/2009 | Dokai et al. ............... 455/41.2 |
| 7,890,053 B2 * | 2/2011 | Washiro .................... 455/41.1 |
| 8,009,101 B2 * | 8/2011 | Ikemoto et al. ........ 343/700 MS |
| 8,023,891 B2 * | 9/2011 | Burenkov .................... 455/41.1 |
| 8,194,416 B2 * | 6/2012 | Park et al. ..................... 361/818 |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0032926 A1 | 2/2006 | Baba et al. |
| 2006/0044192 A1 | 3/2006 | Egbert |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0214801 A1 | 9/2006 | Murofushi et al. |
| 2006/0220871 A1 | 10/2006 | Baba et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0200782 A1 | 8/2007 | Hayama et al. |
| 2007/0229276 A1 | 10/2007 | Yamagajo et al. |
| 2007/0252700 A1 | 11/2007 | Ishihara et al. |
| 2007/0252703 A1 | 11/2007 | Kato et al. |
| 2007/0285335 A1 | 12/2007 | Bungo et al. |
| 2007/0290928 A1 | 12/2007 | Chang et al. |
| 2008/0024156 A1 | 1/2008 | Arai et al. |
| 2008/0087990 A1 | 4/2008 | Kato et al. |
| 2008/0150719 A1 | 6/2008 | Cote et al. |
| 2008/0169905 A1 | 7/2008 | Slatter |
| 2008/0272885 A1 | 11/2008 | Atherton |
| 2009/0002130 A1 | 1/2009 | Kato |
| 2009/0009007 A1 | 1/2009 | Kato et al. |
| 2009/0009330 A1 | 1/2009 | Sakama et al. |
| 2009/0021446 A1 | 1/2009 | Kataya et al. |
| 2009/0065594 A1 | 3/2009 | Kato et al. |
| 2009/0109102 A1 | 4/2009 | Dokai et al. |
| 2009/0146821 A1 | 6/2009 | Kato et al. |
| 2009/0160719 A1 | 6/2009 | Kato et al. |
| 2009/0201116 A1 | 8/2009 | Orihara |
| 2009/0224061 A1 | 9/2009 | Kato et al. |
| 2009/0231106 A1 | 9/2009 | Okamura |
| 2009/0262041 A1 | 10/2009 | Ikemoto et al. |
| 2009/0278687 A1 | 11/2009 | Kato |
| 2010/0038437 A1 | 2/2010 | Kato et al. |

FOREIGN PATENT DOCUMENTS

| | | |
|---|---|---|
| DE | 10 2006 057 369 A1 | 6/2008 |
| DE | 11 2008 000 065 B4 | 7/2011 |
| EP | 0 694 874 A2 | 1/1996 |
| EP | 0 977 145 A2 | 2/2000 |
| EP | 1 010 543 A1 | 6/2000 |
| EP | 1 160 915 A2 | 12/2001 |
| EP | 1 170 795 A2 | 1/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 548 872 A1 | 6/2005 |
| EP | 1 703 589 A1 | 9/2006 |
| EP | 1 744 398 A1 | 1/2007 |
| EP | 1 841 005 A1 | 10/2007 |
| EP | 1 865 574 A1 | 12/2007 |
| EP | 1 976 056 A1 | 10/2008 |
| EP | 1 993 170 A1 | 11/2008 |
| EP | 2 009 738 A1 | 12/2008 |
| EP | 2 012 258 A1 | 1/2009 |
| EP | 2 148 449 A1 | 1/2010 |
| EP | 2 251 934 A1 | 11/2010 |
| GB | 2 305 075 A | 3/1997 |
| JP | 50-143451 A | 11/1975 |
| JP | 61-042085 A | 2/1986 |
| JP | 62-127140 U | 8/1987 |
| JP | 02-164105 A | 6/1990 |
| JP | 03-262313 A | 11/1991 |
| JP | 04-150011 A | 5/1992 |

(56) References Cited

FOREIGN PATENT DOCUMENTS

| | | |
|---|---|---|
| JP | 04-167500 A | 6/1992 |
| JP | 05-327331 A | 12/1993 |
| JP | 6-53733 A | 2/1994 |
| JP | 06-077729 A | 3/1994 |
| JP | 06-177635 A | 6/1994 |
| JP | 6-260949 A | 9/1994 |
| JP | 07-183836 A | 7/1995 |
| JP | 08-056113 A | 2/1996 |
| JP | 8-87580 A | 4/1996 |
| JP | 08-88586 A | 4/1996 |
| JP | 08-088586 A | 4/1996 |
| JP | 11-149537 A | 6/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 9-93029 A | 4/1997 |
| JP | 09-245381 A | 9/1997 |
| JP | 09-252217 A | 9/1997 |
| JP | 09-270623 A | 10/1997 |
| JP | 9-512367 A | 12/1997 |
| JP | 10-069533 A | 3/1998 |
| JP | 10-69533 A | 3/1998 |
| JP | 10-505466 A | 5/1998 |
| JP | 10-171954 A | 6/1998 |
| JP | 10-193849 A | 7/1998 |
| JP | 10-193851 A | 7/1998 |
| JP | 10-293828 A | 11/1998 |
| JP | 11-039441 A | 2/1999 |
| JP | 11-075329 A | 3/1999 |
| JP | 11-085937 A | 3/1999 |
| JP | 11-88241 A | 3/1999 |
| JP | 11-102424 A | 4/1999 |
| JP | 11-103209 A | 4/1999 |
| JP | 11-149536 A | 6/1999 |
| JP | 11-149538 A | 6/1999 |
| JP | 11-219420 A | 8/1999 |
| JP | 11-220319 A | 8/1999 |
| JP | 11-328352 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2005-229474 A | 1/2000 |
| JP | 2000022421 A | 1/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |
| JP | 2000-137785 A | 5/2000 |
| JP | 2000-148948 A | 5/2000 |
| JP | 2000-172812 A | 6/2000 |
| JP | 2000-209013 A | 7/2000 |
| JP | 2000-222540 A | 8/2000 |
| JP | 2000-510271 A | 8/2000 |
| JP | 2000-242754 A | 9/2000 |
| JP | 2000-243797 A | 9/2000 |
| JP | 2000-251049 A | 9/2000 |
| JP | 2000-261230 A | 9/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-315908 A | 11/2000 |
| JP | 2000-321984 A | 11/2000 |
| JP | 3075400 U | 11/2000 |
| JP | 2000-349680 A | 12/2000 |
| JP | 2001-10264 A | 1/2001 |
| JP | 2001-028036 A | 1/2001 |
| JP | 2007-18067 A | 1/2001 |
| JP | 2001-043340 A | 2/2001 |
| JP | 2001-66990 A | 3/2001 |
| JP | 2001-76111 A | 3/2001 |
| JP | 2001-505682 A | 4/2001 |
| JP | 2001-168628 A | 6/2001 |
| JP | 2001-188890 A | 7/2001 |
| JP | 2001-240046 A | 9/2001 |
| JP | 2001-256457 A | 9/2001 |
| JP | 2001-257292 A | 9/2001 |
| JP | 2001-514777 A | 9/2001 |
| JP | 2001-319380 A | 11/2001 |
| JP | 2001-331976 A | 11/2001 |
| JP | 2001-332923 A | 11/2001 |
| JP | 2001-339226 A | 12/2001 |
| JP | 2001-344574 A | 12/2001 |
| JP | 2001-351084 A | 12/2001 |
| JP | 2001-352176 A | 12/2001 |
| JP | 2002-024776 A | 1/2002 |
| JP | 2002-026513 A | 1/2002 |
| JP | 2002-32731 A | 1/2002 |
| JP | 2002-042076 A | 2/2002 |
| JP | 2002-063557 A | 2/2002 |
| JP | 2002-505645 A | 2/2002 |
| JP | 2002-76750 A | 3/2002 |
| JP | 2002-076750 A | 3/2002 |
| JP | 2002-150245 A | 5/2002 |
| JP | 2002-157564 A | 5/2002 |
| JP | 2002-158529 A | 5/2002 |
| JP | 2002-175508 A | 6/2002 |
| JP | 2002-183690 A | 6/2002 |
| JP | 2002-185358 A | 6/2002 |
| JP | 2002-204117 A | 7/2002 |
| JP | 2002-522849 A | 7/2002 |
| JP | 2002-230128 A | 8/2002 |
| JP | 2002-232221 A | 8/2002 |
| JP | 2002-252117 A | 9/2002 |
| JP | 2002-259934 A | 9/2002 |
| JP | 2002-280821 A | 9/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-362613 A | 12/2002 |
| JP | 2002-366917 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-026177 A | 1/2003 |
| JP | 2003-030612 A | 1/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-76963 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-158414 A | 5/2003 |
| JP | 2003-168760 A | 6/2003 |
| JP | 2003-179565 A | 6/2003 |
| JP | 2003-187207 A | 7/2003 |
| JP | 2003-187211 A | 7/2003 |
| JP | 2003-188338 A | 7/2003 |
| JP | 2003-188620 A | 7/2003 |
| JP | 2003-198230 A | 7/2003 |

(56) References Cited

FOREIGN PATENT DOCUMENTS

| | | |
|---|---|---|
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-309418 A | 10/2003 |
| JP | 2003-317060 A | 11/2003 |
| JP | 2003-331246 A | 11/2003 |
| JP | 2003-332820 A | 11/2003 |
| JP | 2003-536302 A | 12/2003 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-93693 A | 3/2004 |
| JP | 2004-096566 A | 3/2004 |
| JP | 2004-127230 A | 4/2004 |
| JP | 2004-213582 A | 7/2004 |
| JP | 2004-519916 A | 7/2004 |
| JP | 2004-234595 A | 8/2004 |
| JP | 2004-253858 A | 9/2004 |
| JP | 2004-527864 A | 9/2004 |
| JP | 2004-280390 A | 10/2004 |
| JP | 2004-287767 A | 10/2004 |
| JP | 2004-297249 A | 10/2004 |
| JP | 2004-297681 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-18156 A | 1/2005 |
| JP | 2005-124061 A | 5/2005 |
| JP | 2005-128592 A | 5/2005 |
| JP | 2005-129019 A | 5/2005 |
| JP | 2005-135132 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-210676 A | 8/2005 |
| JP | 2005-210680 A | 8/2005 |
| JP | 2005-217822 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-284352 A | 10/2005 |
| JP | 2005-293537 A | 10/2005 |
| JP | 2005-295135 A | 10/2005 |
| JP | 2005-311205 A | 11/2005 |
| JP | 2005-321305 A | 11/2005 |
| JP | 2005-322119 A | 11/2005 |
| JP | 2005-335755 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-13976 A | 1/2006 |
| JP | 2006-025390 A | 1/2006 |
| JP | 2006-031766 A | 2/2006 |
| JP | 2006-39902 A | 2/2006 |
| JP | 2006-42059 A | 2/2006 |
| JP | 2006-42097 A | 2/2006 |
| JP | 2006-053833 A | 2/2006 |
| JP | 2006-67479 A | 3/2006 |
| JP | 2006-72706 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148462 A | 6/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-270212 A | 10/2006 |
| JP | 2006-270766 A | 10/2006 |
| JP | 2006-285911 A | 10/2006 |
| JP | 2006-295879 A | 10/2006 |
| JP | 2006-302219 A | 11/2006 |
| JP | 2006-311239 A | 11/2006 |
| JP | 2006-323481 A | 11/2006 |
| JP | 2006309401 A | 11/2006 |
| JP | 2006-339964 A | 12/2006 |
| JP | 2007-007888 A | 1/2007 |
| JP | 2007-13120 A | 1/2007 |
| JP | 2007-28002 A | 2/2007 |
| JP | 2007-043535 A | 2/2007 |
| JP | 2007-048126 A | 2/2007 |
| JP | 2007-65822 A | 3/2007 |
| JP | 2007-79687 A | 3/2007 |
| JP | 2007-81712 A | 3/2007 |
| JP | 2007-096768 A | 4/2007 |
| JP | 2007-102348 A | 4/2007 |
| JP | 2007-122542 A | 5/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 2007-172369 A | 7/2007 |
| JP | 2007-172527 A | 7/2007 |
| JP | 2007-228325 A | 9/2007 |
| JP | 2007-266999 A | 10/2007 |
| JP | 2007-272264 A | 10/2007 |
| JP | 2007-287128 A | 11/2007 |
| JP | 2007-312350 A | 11/2007 |
| JP | 2007-324865 A | 12/2007 |
| JP | 2008-033716 A | 2/2008 |
| JP | 2008-72243 A | 3/2008 |
| JP | 4069958 B2 | 4/2008 |
| JP | 2008-107947 A | 5/2008 |
| JP | 2008-148345 A | 6/2008 |
| JP | 2008-519347 A | 6/2008 |
| JP | 2008-160874 A | 7/2008 |
| JP | 2008-234608 A | 10/2008 |
| JP | 11-175678 A | 1/2009 |
| JP | 2009-25870 A | 2/2009 |
| JP | 2009-27291 A | 2/2009 |
| JP | 2009-044715 A | 2/2009 |
| NL | 9100176 A | 3/1992 |
| NL | 9100347 A | 3/1992 |
| WO | 99/67754 A1 | 12/1999 |
| WO | 00/10122 A2 | 2/2000 |
| WO | 01/95242 A2 | 12/2001 |
| WO | 02/48980 A1 | 6/2002 |
| WO | 02/061675 A1 | 8/2002 |
| WO | 02/097723 A1 | 12/2002 |
| WO | 03/079305 A1 | 9/2003 |
| WO | 20041036772 A1 | 4/2004 |
| WO | 2004/070879 A | 8/2004 |
| WO | 2004/072892 A1 | 8/2004 |
| WO | 2005/073937 A | 8/2005 |
| WO | 2005/091434 A1 | 9/2005 |
| WO | 2005/115849 A1 | 12/2005 |

(56) References Cited

FOREIGN PATENT DOCUMENTS

| | | |
|---|---|---|
| WO | 2006/045682 A | 5/2006 |
| WO | 2006/048663 A1 | 5/2006 |
| WO | 2006/114821 A1 | 11/2006 |
| WO | 2007/083574 A1 | 7/2007 |
| WO | 2007/083575 A1 | 7/2007 |
| WO | 2007/086130 A1 | 8/2007 |
| WO | 2007/102360 A1 | 9/2007 |
| WO | 2007/119310 A1 | 10/2007 |
| WO | 2007/125683 A1 | 11/2007 |
| WO | 2007/138857 A1 | 12/2007 |
| WO | 2008/007606 A | 1/2008 |
| WO | 2008/126458 A1 | 10/2008 |
| WO | 2008/140037 A1 | 11/2008 |
| WO | 2008/142957 A1 | 11/2008 |
| WO | 2009/008296 A1 | 1/2009 |
| WO | 2009/011376 A1 | 1/2009 |
| WO | 2009/081719 A1 | 7/2009 |
| WO | 2009/110381 A1 | 9/2009 |

OTHER PUBLICATIONS

Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device"; U.S. Appl. No. 11/624,382; filed on Jan. 18, 2007.
Dokai et al.: "Wireless IC Device, and Component for Wireless IC Device"; U.S. Appl. No. 11/930,818; filed on Oct. 31, 2007.
Kato et al.: "Wireless IC Device"; U.S. Appl. No. 12/042,399; filed on Mar. 5, 2008.
Official communication issued in related U.S. Appl. No. 12/042,399; mailed on Aug. 25, 2008.
English translation of NL9100176, published on Mar. 2, 1992.
English translation of NL9100347, published on Mar. 2, 1992.
Kato et al.: "Antenna"; U.S. Appl. No. 11/928,502; filed on Oct. 30, 2007.
Kato et al.: "Wireless IC Device"; U.S. Appl. No. 12/211,117; filed on Sep. 16, 2008.
Kato et al.: "Antenna"; U.S. Appl. No. 11/688,290; filed Mar. 20, 2007.
Kato et al.: "Electromagnetic-Coupling-Module-Attached Article"; U.S. Appl. No. 11/740,509; filed on Apr. 26, 2007.
Kato et al.: "Product Including Power Supply Circuit Board"; U.S. Appl. No. 12/234,949; filed on Sep. 22, 2008.
Kato et al.: "Data Coupler"; U.S. Appl. No. 12/252,475; filed on Oct. 16, 2008.
Kato et al.; "Information Terminal Device"; U.S. Appl. No. 12/267,666; filed on Nov. 10, 2008.
Kato et al.: "Wireless IC Device and Wireless IC Device Composite Component"; U.S. Appl. No. 12/276,444; filed on Nov. 24, 2008.
Dokai et al.: "Optical Disc"; U.S. Appl. No. 12/326,916; filed on Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400; filed on Nov. 20, 2008.
Kato: "Wireless IC Device"; U.S. Appl. No. 11/964,185; filed on Dec. 26, 2007.
Kato et al.: "Radio Frequency IC Device"; U.S. Appl. No. 12/336,629; filed Dec. 17, 2008.
Kato et al.: "Wireless IC Device and Component for Wireless IC Device"; U.S. Appl. No. 12/339,198; filed on Dec. 19, 2008.
Ikemoto et al.: "Wireless IC Device"; U.S. Appl. No. 11/851,651; filed on Sep. 7, 2007.
Kataya et al.: "Wireless IC Device and Electronic Device"; U.S. Appl. No. 11/851,661; filed Sep. 7, 2007.
Dokai et al.: "Antenna and Radio IC Device"; U.S. Appl. No. 12/350,307; filed on Jan. 8, 2009.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690; filed on Jan. 26, 2009.
Dokai et al.: "Test System for Radio Frequency IC Devices and Method of Manufacturing Radio Frequency IC Devices Using the Same"; U.S. Appl. No. 12/388,826; filed feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; Attorney Docket No. 36856.1789; U.S. Appl. No. 12/390,556; filed on Feb. 23, 2009.
Kato et al.: "Inductively Coupled Module and Item With Inductively Coupled Module"; U.S. Appl. No. 12/398,497; filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767; filed Mar. 11, 2009.
Taniguchi et al.: "Antenna Device and Radio Frequency IC Device"; U.S. Appl. No. 12/326,117; filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369; filed Apr. 20, 2009.
Kato: "Wireless IC Device"; U.S. Appl. No. 12/429,346; filed Apr. 24, 2009.
Official Communication issued in International Patent Application No. PCT/JP2009/069486, mailed on Mar. 2, 2010.
Kato: "Radio IC Device"; U.S. App. No. 13/080,775; filed on Apr. 6, 2011.
Kato et al.: "Antenna and Wireless IC Device"; U.S. Appl. No. 13/083,626; filed on Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., LTD, vol. 7, No. 9, 2007, pp. 4-12.
Dokai et al.: "Wireless IC Device"; U.S. Appl. No. 13/088,480; filed on Apr. 18, 2011.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module," U.S. Appl. No. 12/536,669; filed on Aug. 6, 2009.
Dokai et al.: "Wireless IC Device and Component for Wireless IC Device," U.S. Appl. No. 12/543,553; filed on Aug. 19, 2009.
Shioya et al.: "Wireless IC Device," U.S. Appl. No. 12/551,037; filed on Aug. 31, 2009.
Ikemoto: "Wireless IC Device and Manufacturing Method Thereof," U.S. Appl. No. 12/579,672; filed on Oct. 15, 2009.
Official communication issued in International Application No. PCT/JP2008/058614, mailed on Jun. 10, 2008.
Official Communication issued in International Patent Application No. PCT/JP2008/063025, mailed on Aug. 12, 2008.
Kato et al.: "Wireless IC Device," U.S. Appl. No. 12/603,608; filed on Oct. 22, 2009.
Kato et al.: "Wireless IC Device," U.S. Appl. No. 12/688,072; filed on Jan. 15, 2010.

(56) References Cited

OTHER PUBLICATIONS

Official Communication issued in International Patent Application No. PCT/JP2009/053693, mailed on Jun. 9, 2009.
Kato: "Composite Antenna," U.S Appl. No. 12/845,846; filed on July 29, 2010.
Official Communication issued in International Patent Application No. PCT/JP2009/053690, mailed on Jun. 2, 2009.
Kato et al.: "Radio Frequency IC Device and Radio Communication System," U.S. Appl. No. 12/859,340; filed on Aug. 19, 2010.
Official Communication issued in International Patent Application No. PCT/JP2009/055758, mailed on Jun. 23, 2009.
Kato et al.: "Wireless IC Device," U.S. Appl. No. 12/859,880; filed on Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device," U.S. Appl. No. 12/861,945; filed on Aug. 24, 2010.
Kato: "Wireless IC Device and Electromagnetic Coupling Module," U.S. Appl. No. 12/890,895; filed on Sep. 27, 2010.
Official Communication issued in International Patent Application No. PCT/JP2009/059410, mailed on Aug. 4, 2009.
Kato et al.: "Wireless IC Device" U.S. Appl. No. 12/902,174; filed on Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854; filed on Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device," U.S. Appl. No. 12/469,896; filed on May 21, 2009.
Ikemoto et al.: "Wireless IC Device," U.S. Appl. No. 12/496,709; filed on Jul. 2, 2009.
Official communication issued in counterpart International Application No. PCT/JP2008/062947, mailed Aug. 19, 2008.
Official communication isued in counterpart International Application No. PCT/JP2008/056026, mailed Jul. 1, 2008.
Ikemoto et al.: "Wireless IC Device and Electronic Apparatus," U.S. Appl. No. 12/503,188; filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device," U.S. Appl. No. 121510,338; filed on Jul. 28, 2009.
Kato et al.: "Wireless IC Device," U.S. Appl. No. 12/510,340; filed on Jul. 28, 2009.
Kato: "Wireless IC Device," U.S. Appl. No. 12/510,344; filed on Jul. 28, 2009.
Kato et al.: "Wireless IC Device," U.S. Appl. No. 12/510,347; filed on Jul. 28, 2009.
Official Communication issued in corresponding German Patent Application No. 11 2009 003 613.9, mailed on Nov. 16, 2012.
Official Communication issued in International Patent Application No. PCT/JP2009/056934, mailed on Jun. 30, 2009.
Kato et al.: "Wireless IC Device"; U.S. Appl. No. 12/903,242; filed on Oct. 13, 2010.
Kato et al.: "Wireless IC Device"; U.S. Appl. No. 12/940,103; filed on Nov. 5, 2010.
Kato et al.: "Wireless IC Device System and Method of Determining Authenticity of Wireless IC Device"; U.S. Appl. No. 12/940,105; filed on Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099; filed on Nov. 11, 2010.
Kato et al.: Wireless IC Device and Manufacturing Method Thereof; U.S. Appl. No. 12/961,599; filed on Dec. 7, 2010.
Kataya et al.: "Radio Frequency IC Device and Electronic Apparatus"; U.S. Appl. No. 12/959,454; filed on Dec. 3, 2010.
Ikemoto et al.:"Radio IC Device"; U.S. Appl. No. 12/981,582; filed on Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695; filed on Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693; filed on Feb. 8, 2011.
Kato: "Wireless IC Device"; U.S. Appl. No. 13/080,781; filed on Apr. 6, 2011.

\* cited by examiner

HIGH-FREQUENCY DEVICE AND WIRELESS IC DEVICE

BACKGROUND OF THE INVENTION

1. Field of the Invention

The present invention relates to a high-frequency device and a wireless IC device, and, more particularly, to a high-frequency device and a wireless IC device preferably for use in an RFID (Radio Frequency Identification) system.

2. Description of the Related Art

In the related art, an RFID system has been developed as an article management system, which includes a reader/writer that generates an electromagnetic wave, and a wireless IC (also referred to as IC tag, wireless IC chip, or high-frequency device) that has predetermined information stored therein and is attached to an article, a container, or other suitable object, and non-contact communication is established between the reader/writer and the IC chip to transmit the information therebetween. The wireless IC is coupled to an antenna (radiator plate), thereby enabling communication with the reader/writer.

In general, such a wireless IC is manufactured by a roll-to-roll process described in Nagai, "Mounting Technique of RFID by Roll-To-Roll Process", MATERIAL STAGE, TECHNICAL INFORMATION INSTITUTE CO., LTD, VOL. 7 NO. 9 2007 (hereinafter referred to as "Nagai"). However, in the roll-to-roll process, as described in Nagai, since a PET film is used, static electricity occurs and there is a possibility that electrostatic breakdown of the wireless IC will occur. In addition, there is a possibility that electrostatic breakdown of an antenna will occur, when a potential difference occurs between both ends thereof.

SUMMARY OF THE INVENTION

To overcome the problems described above, preferred embodiments of the present invention provide a high-frequency device and a wireless IC device which prevent insulation breakdown and which have high reliability.

A high-frequency device according to a first preferred embodiment of the present invention preferably includes a wireless IC and a board which is coupled to the wireless IC and electrically connected to a radiator plate. A static electricity countermeasure element is preferably provided in the board.

A wireless IC device according to a second preferred embodiment of the present invention preferably includes a wireless IC, a radiator plate, and a board which is coupled to the wireless IC and electrically connected to the radiator plate. A static electricity countermeasure element is preferably provided in the board.

As the static electricity countermeasure element, an inductor connected in parallel between the wireless IC and the radiator plate and/or a capacitance connected in series between the wireless IC and the radiator plate, for example, may preferably be used. An impedance of the inductor at the frequency of static electricity is preferably less than an impedance of the wireless IC.

According to the various preferred embodiments of the present invention, since the static electricity countermeasure element is provided in the board, a wireless IC and an antenna are prevented from being broken by static electricity which is inevitably produced in a manufacturing process.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of a high-frequency device and a wireless IC device according to the present invention will be described with reference to the accompanying drawings. Note that, in the drawings, common elements and portions are designated by the same reference numerals, and repetitive description is omitted.

A high-frequency device according to various preferred embodiments of the present invention preferably include a wireless IC and a board which is coupled to the wireless IC and electrically connected to a radiator plate, and a static electricity countermeasure element is provided in the board. As is known in the related art, the wireless IC includes a clock circuit, a logic circuit, a memory circuit, and other suitable circuit elements, includes necessary information stored therein, and is provided with an input terminal electrode and an output terminal electrode.

Figure 1:
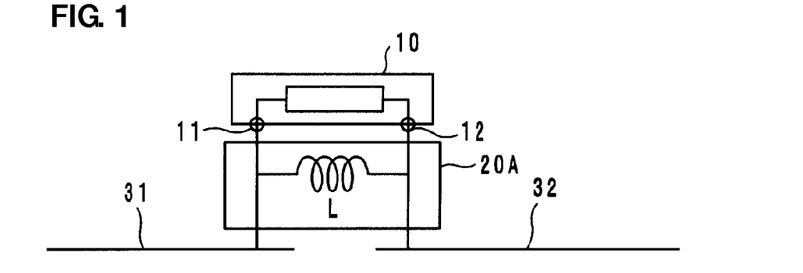
FIG. 1 is an equivalent circuit diagram showing a high-frequency device according to a first preferred embodiment of the present invention.

As shown in FIG. 1, a first preferred embodiment of the present invention preferably includes a wireless IC chip 10 and a board 20A, and an inductor L is provided in the board 20A as a static electricity countermeasure element. The inductor L is preferably connected in parallel between input and output terminal electrodes 11 and 12 of the wireless IC chip 10 and radiator plates 31 and 32.

The inductor L is preferably configured such that the impedance of the inductor L at the frequency (usually, about 200 MHz or less) of static electricity is less than the impedance of the wireless IC chip 10. Thus, static electricity entering through the radiator plates 31 and 32 passes through the inductor L and does not enter the wireless IC chip 10, thereby preventing electrostatic breakdown of the wireless IC chip 10.

Note that the characteristic of the inductor L can also be expressed as follows. That is, an impedance ($Z_L$) of the inductor L, which is inductive reactance ($X_L$), at the frequency of static electricity, is preferably less than an impedance ($Z_C$) of the wireless IC chip 10 which is capacitive reactance ($X_C$). In addition, an impedance ($Z_L$) of the inductor L, which is inductive reactance ($X_L$), in the UHF band, is preferably greater than the impedance ($Z_C$) of the wireless IC chip 10 which is capacitive reactance ($X_C$).

Figure 4:
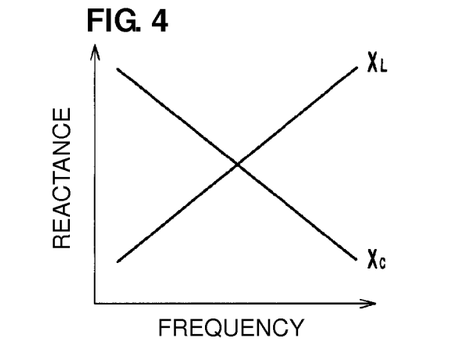
FIG. 4 is a graph showing the relationship between frequency and reactance.

An impedance has a real portion (R: resistance) and an imaginary portion (X: reactance). The wireless IC chip 10 has a capacitance (C) component. Concerning the imaginary portion, the impedance ($Z_L$) which is inductive reactance ($X_L$) is determined by $Z_L=\omega L$, and thus, increases as frequency increase as shown in FIG. 4. On the other hand, the impedance ($Z_C$) which is capacitive reactance ($X_C$) is determined by $Z_C=1/\omega C$, and thus decreases as frequency increases. Thus, in the frequency band of static electricity, the impedance ($Z_L$) which is inductive reactance ($X_L$) is less than the impedance ($Z_C$) which is capacitive reactance ($X_C$), and in the UHF band, the impedance ($Z_L$) which is inductive reactance ($X_L$) is greater than the impedance ($Z_C$) which is capacitive reactance ($X_C$).

Note that, concerning the real portion, the wireless IC chip 10 does not operate at the frequency of static electricity, and thus, the resistance ($R_C$) of the wireless IC chip 10 in the frequency band of static electricity becomes infinite. In the UHF band, the wireless IC chip 10 operates, and preferably has a resistance ($R_C$) of about 10Ω to about 20Ω, for example. The inductor L preferably has a resistance ($R_L$) of several mΩ to several hundred mΩ, for example, at the frequency of static electricity, and preferably has a resistance ($R_L$) of several tens mΩ to several hundreds mΩ in the UHF band. This is because the resistance ($R_L$) increases as frequency increases because of a skin effect, but the resistance ($R_L$) does not substantially change depending on a frequency band. Note that in the UHF band, as described above, the impedance ($Z_L$) of the inductor L which is inductive reactance ($X_L$) is sufficiently greater than the impedance ($Z_C$) of the wireless IC chip 10 which is capacitive reactance ($X_C$).

In other words, in the frequency band of static electricity, the impedance of the wireless IC chip 10 is preferably greater than the impedance of the inductor L, and a signal passes through the inductor L, thereby preventing electrostatic breakdown of the wireless IC chip 10. In addition, in the UHF band, the impedance of the inductor L is preferably greater than the impedance of the wireless IC chip 10, and a signal passes through the wireless IC chip 10. Note that the reason why the real portion of the inductor L is preferably several tens mΩ to several Ω is that noise cannot be converted into heat to be consumed unless it is several tens mΩ or greater, and the transmission efficiency is low unless it is several Ω or less.

When the inductor L is not provided, that is, when static electricity countermeasures are not provided, the electrostatic voltage resistance characteristic of the wireless IC chip 10 is about 300 V. When the inductance value of the inductor L is about 120 nH, the electrostatic voltage resistance characteristic is improved to be about 700 V, and when the inductance value is about 30 nH, the electrostatic voltage resistance characteristic is improved to be about 2800 V.

Figure 2A:
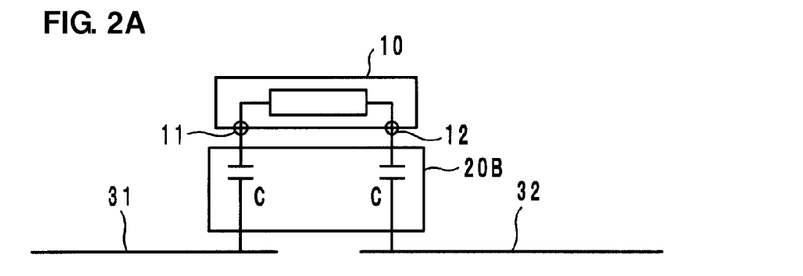
FIGS. 2A to 2C are equivalent circuit diagrams showing a high-frequency device according to a second preferred embodiment of the present invention.
Figure 2B:
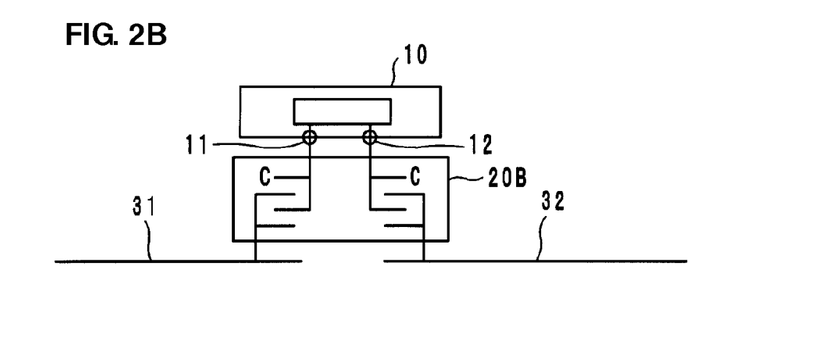
Figure 2C:
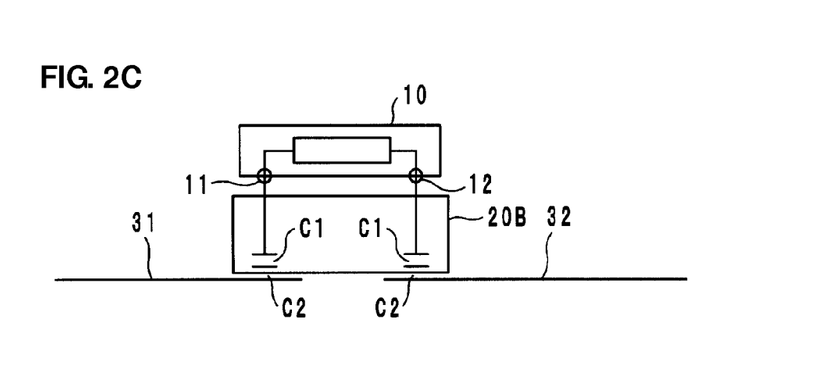

As shown in FIG. 2A, a second preferred embodiment of the present invention preferably includes the wireless IC chip 10 and a board 20B, and two capacitances C are preferably provided as the static electricity countermeasure element in the board 20B. The capacitances C are preferably connected in series between the input and output terminal electrodes 11 and 12 of the wireless IC chip 10 and the radiator plates 31 and 32. In addition, as shown in FIG. 2B, each capacitance C may preferably be defined by a plurality of electrodes. Further, as shown in FIG. 2C, capacitances C1 and C2 may preferably be coupled to each other. In these high-frequency devices, static electricity entering through the radiator plates 31 and 32 is blocked by the capacitances C, C1, and C2, and does not enter the wireless IC chip 10, thereby preventing electrostatic breakdown of the wireless IC chip 10.

Figure 3:
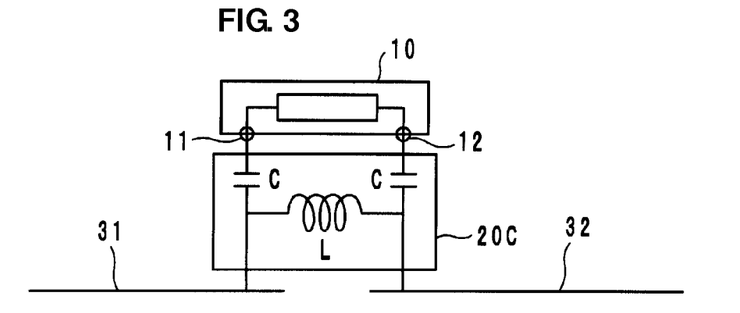
FIG. 3 is an equivalent circuit diagram showing a high-frequency device according to a third preferred embodiment of the present invention.

As shown in FIG. 3, a third preferred embodiment of the present invention preferably includes the wireless IC chip 10 and a board 20C, and the inductor L and the capacitances C are preferably provided as the static electricity countermeasure element in the board 20C. The inductor L is preferably connected in parallel between the input and output terminal electrodes 11 and 12 of the wireless IC chip 10 and the radiator plates 31 and 32, and the capacitances C are preferably connected in series between the input and output terminal electrodes 11 and 12 of the wireless IC chip 10 and the radiator plates 31 and 32. The functions of the inductor L and the capacitances C are substantially the same as those in the above-mentioned first and second preferred embodiments.

As shown in FIGS. 1, 2A to 2C, and 3, the high-frequency device may include the wireless IC chip 10 and the board 20 (20A, 20B, 20C), but a circuit of the wireless IC and a circuit of the board 20 (the inductor L or the capacitances C) may preferably be integrally incorporated into a single board. Alternatively, a power supply circuit board including a resonant circuit which resonates at a frequency used in an RFID system may preferably be provided in addition to the wireless IC chip 10 and the board 20. Still alternatively, the wireless IC may preferably be integrally included in a power supply circuit board. Still alternatively, the wireless IC, the static electricity countermeasure element, and a power supply circuit may preferably be included in a single board.

In the structure in which each of the boards 20A, 20B, and 20C is coupled to the end portions of the radiator plates 31 and 32 as in the first to third preferred embodiments, a single transmission path of a signal is provided, and the signal is efficiently transmitted to the wireless IC chip 10. Thus, the electrostatic breakdown prevention effect is outstanding. Further, the capacitance values of a left and right pair of the capacitances C, or C1 and C2 shown in FIGS. 2A to 2C and 3 are the same or substantially the same. Since the capacitance values of a left and right pair of the capacitances are the same or substantially the same, the balance of the wireless IC chip 10 can be maintained.

Hereinafter, specific examples of the boards 20A, 20B, and 20C in the first, second, and third preferred embodiments will be described with reference to FIGS. 5 to 8.

Figure 5:
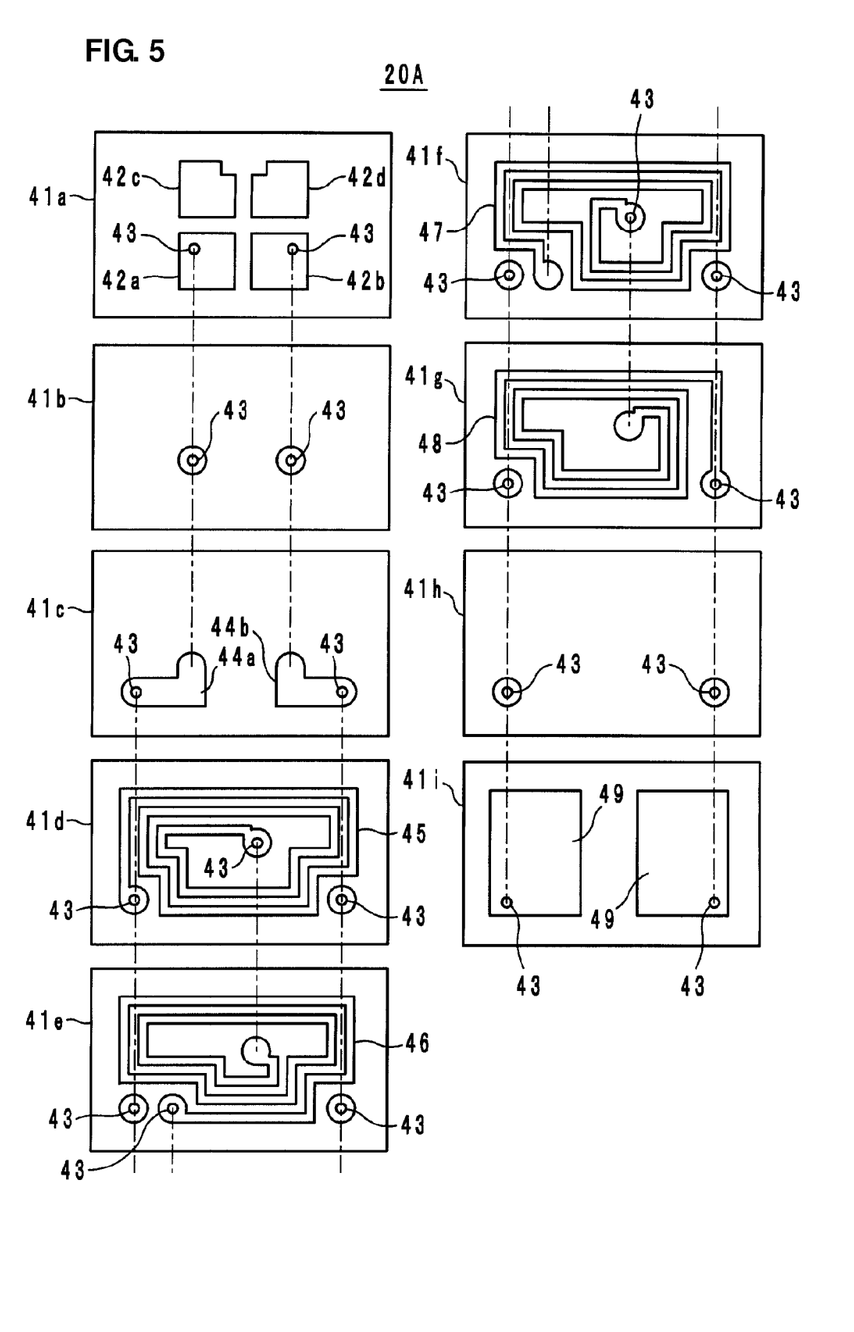
FIG. 5 is a diagram illustrating a first example of a board included in the first preferred embodiment of the present invention.

As shown in FIG. 5, a first example of the board 20A included in the first preferred embodiment is preferably a laminate of a plurality of sheets 41a to 41i in each of which electrodes are provided, and each sheet is preferably made of a ceramic or a resin, for example. The ceramic board has rigidity. The resin board preferably has flexibility, and is suitable for a manufacturing method by a roll-to-roll process.

Preferably, electrodes 42a to 42d and via-hole conductors 43 are provided in the sheet 41a, via-hole conductors 43 are provided in the sheet 41b, electrodes 44a and 44b and via-hole conductors 43 are provided in the sheet 41c, the electrodes 45 to 48 and via-hole conductors 43 are provided in the sheets 41d to 41g, via-hole conductors 43 are provided in the sheet 41h, and electrodes 49 and via-hole conductors 43 are provided in the sheet 41i.

The electrodes are electrically connected to each other via the via-hole conductors 43 by laminating the sheets 41a to 41i on each other, and the inductor L is defined by the electrodes 45 to 48. The electrodes 42a and 42b on the sheet 41a are connected to the input terminal electrode 11 and the output terminal electrode 12, respectively, of the wireless IC chip 10. Note that the electrodes 42c and 42d on the sheet 41a are connected to mounting terminal electrodes (not shown) of the wireless IC chip 10. The sheet 41i defines a back surface of the board 20A, and the electrodes 49 thereon are connected to the radiator plates 31 and 32.

Figure 6:
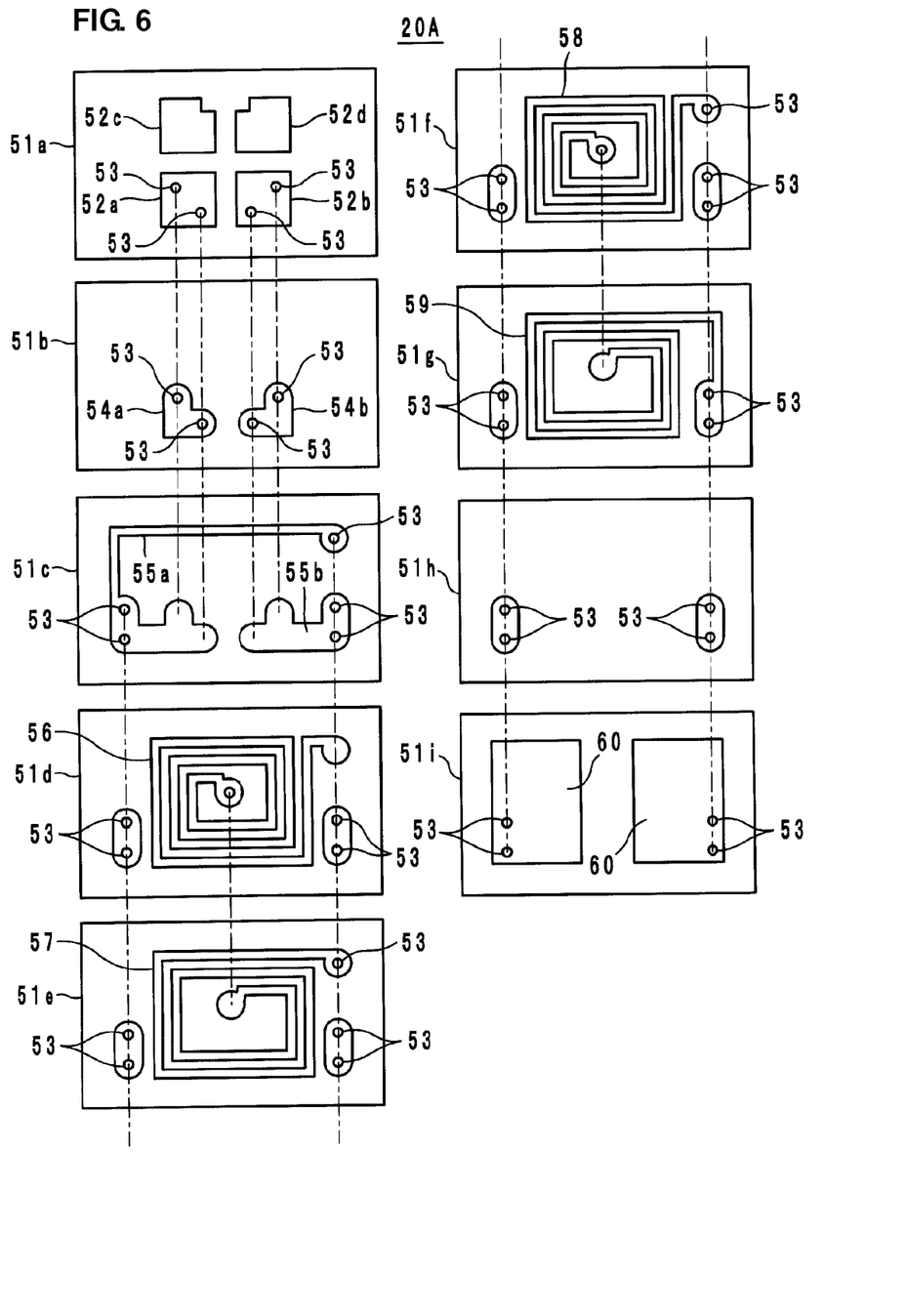
FIG. 6 is a diagram illustrating a second example of a board included in the first preferred embodiment of the present invention.

As shown in FIG. 6, a second example of the board 20A included in the first preferred embodiment is preferably a laminate of a plurality of sheets 51a to 51i in each of which electrodes are provided, and each sheet is preferably made of a ceramic or a resin, for example.

Preferably, electrodes 52a to 52d and via-hole conductors 53 are provided in the sheet 51a, electrodes 54a and 54b and via-hole conductors 53 are provided in the sheet 51b, electrodes 55a and 55b and via-hole conductors 53 are provided in the sheet 51c, electrodes 56 to 59, and via-hole conductors 53 are provided in the sheets 51d to 51g, via-hole conductors 53 are provided in the sheet 51h, and electrodes 60 and via-hole conductors 53 are provided in the sheet 51i.

The electrodes are preferably electrically connected to each other via the via-hole conductors 53 by laminating the sheets 51a to 51i on each other, and the inductor L is defined by the electrodes 56 to 59. The electrodes 52a and 52b on the sheet 51a are connected to the input terminal electrode 11 and the output terminal electrode 12, respectively, of the wireless IC chip 10. Note that the electrodes 52c and 52d on the sheet 51a are connected to the mounting terminal electrodes (not shown) of the wireless IC chip 10. The sheet 51i defines the back surface of the board 20A, and the electrodes 60 thereon are connected to the radiator plates 31 and 32.

Figure 7:
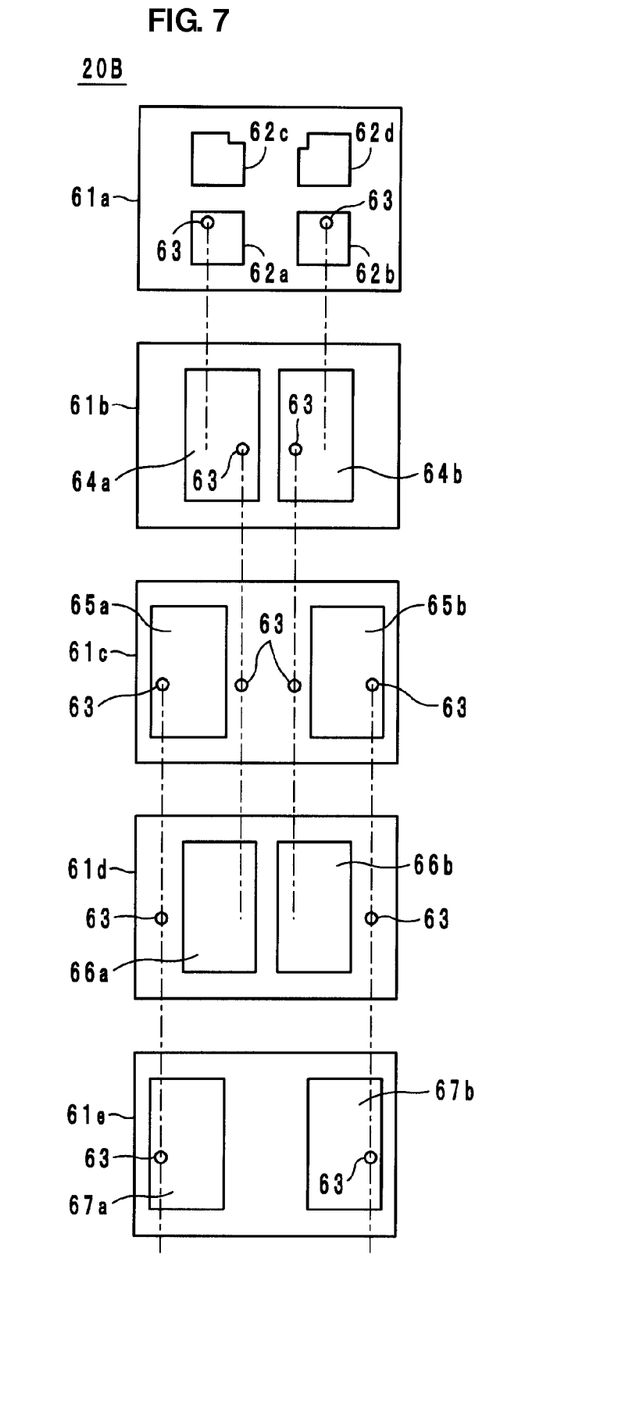
FIG. 7 is a diagram illustrating one example of a board included in the second preferred embodiment of the present invention.

One example of the board 20B included in the second preferred embodiment has an equivalent circuit as shown in FIG. 2B and is preferably a laminate of a plurality of sheets 61a to 61e, as shown in FIG. 7, in each of which electrodes are provided. Each sheet is preferably made of a ceramic or a resin, for example.

Preferably, electrodes 62a to 62d and via-hole conductors 63 are provided in the sheet 61a, electrodes 64a to 67a, electrodes 64b to 67b, and via-hole conductors 63 are provided the sheets 61b to 61e.

The electrodes are preferably electrically connected to each other via the via-hole conductors 63 by laminating the sheets 61a to 61e on each other, and the capacitances C are produced between the electrodes 64a to 67a and between the electrodes 64b to 67b, respectively. The electrodes 62a and 62b on the sheet 61a are connected to the input terminal electrode 11 and the output terminal electrode 12, respectively, of the wireless IC chip 10. Note that the electrodes 62c and 62d on the sheet 61a are connected to the mounting terminal electrodes (not shown) of the wireless IC chip 10. The via-hole conductors 63 provided in the sheet 61e are connected to the radiator plates 31 and 32.

Figure 8:
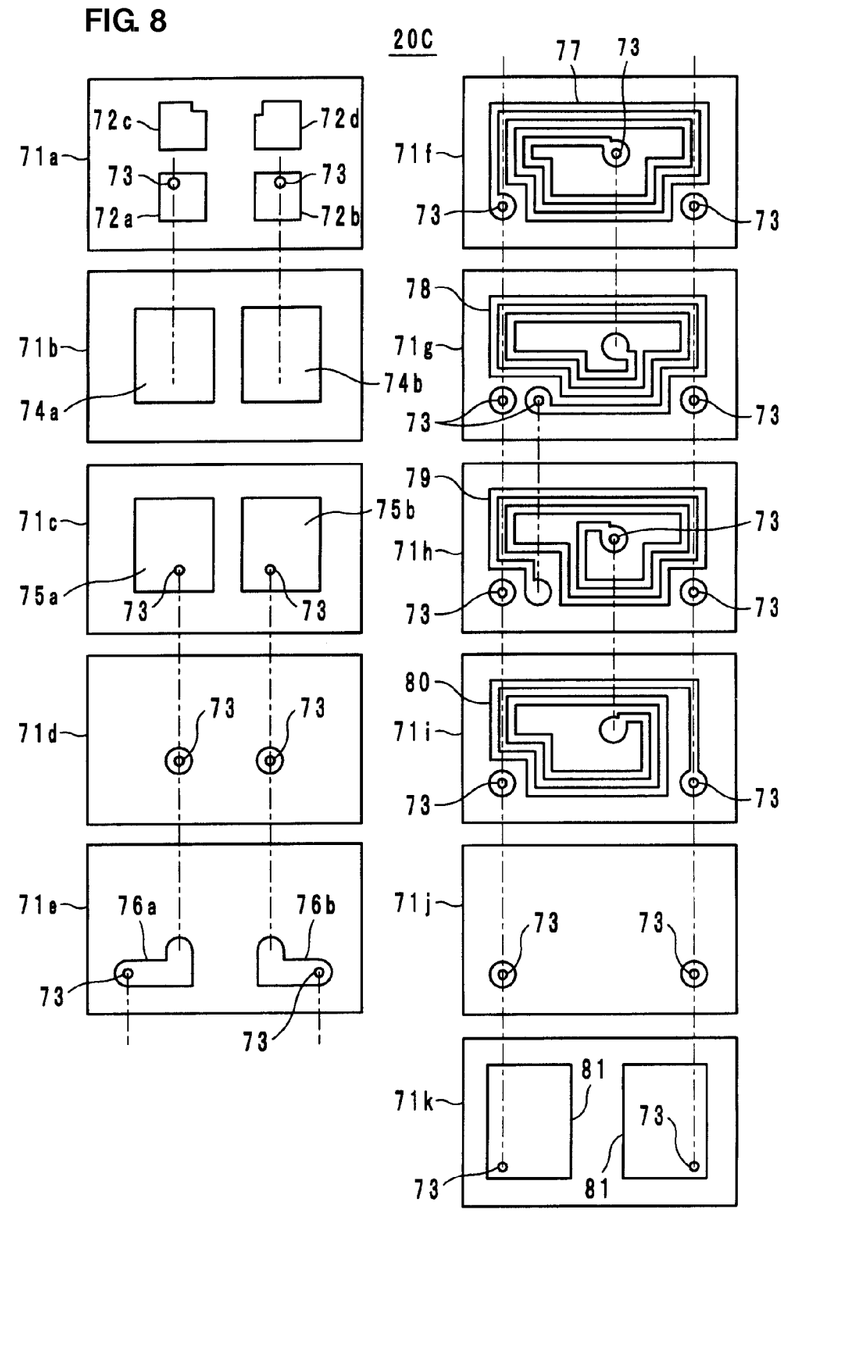
FIG. 8 is a diagram illustrating one example of a board included in the third preferred embodiment of the present invention.

One example of the board 20C included in the third preferred embodiment preferably is a laminate of sheets 71a to 71k as shown in FIG. 8, and each sheet is preferably made of a ceramic or a resin, for example.

Preferably, electrodes 72a to 72d and via-hole conductors 73 are provided in the sheet 71a, electrodes 74a and 74b are provided in the sheet 71b, electrodes 75a and 75b and via-hole conductors 73 are provided in the sheet 71c, via-hole conductors 73 are provided in the sheet 71d, electrodes 76a and 76b and via-hole conductors 73 are provided in the sheet 71e, electrodes 77 to 80 and via-hole conductors 73 are provided in the sheets 71f to 71i, via-hole conductors 73 are provided in the sheet 71j, and electrodes 81 and via-hole conductors 73 are provided in the sheet 71k.

The electrodes are preferably electrically connected to each other via the via-hole conductors 73 by laminating the sheets 71a to 71k on each other, the capacitances C are produced between the electrodes 74a and 75a and between the electrodes 74b and 75b, respectively, and the inductor L is defined by the electrodes 77 to 80. The electrodes 72a and 72b on the sheet 71a are connected to the input terminal electrode 11 and the output terminal electrode 12, respectively, of the wireless IC chip 10. Note that the electrodes 72c and 72d on the sheet 71a are connected to the mounting terminal electrodes (not shown) of the wireless IC chip 10. The sheet 71k defines a back surface of the board 20C, and the electrodes 81 thereon are connected to the radiator plates 31 and 32.

Since the boards 20A, 20B, and 20C include the inductor L and/or the capacitances C defining the static electricity countermeasure element, the wireless IC chip 10 is effectively prevented from being broken by static electricity. In addition, since the plurality of electrode layers are included, shocks can be absorbed when these boards are disposed on the radiator plates 31 and 32. Further, since the plurality of electrode layers overlap each other in a plan view, the shock absorption effect is further improved.

Next, in a wireless IC device according to preferred embodiments of the present invention, the high-frequency device is preferably connected to radiator plates. The high-frequency device may preferably be electrically connected to the radiator plates by solder or may be attached to the radiator plates by an adhesive, for example. Hereinafter, first and second preferred embodiments of the wireless IC device will be described.

Figure 9:
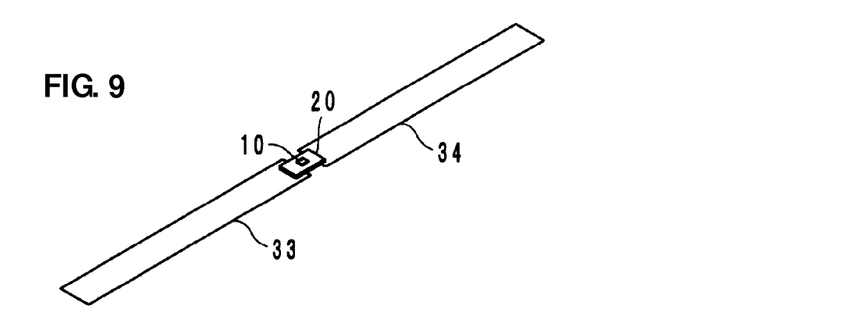
FIG. 9 is a perspective view showing a wireless IC device according to a preferred embodiment of the present invention.

In a preferred embodiment of the present invention, as shown in FIG. 9, the board 20 (20A, 20B, 20C) including the wireless IC chip 10 disposed thereon is preferably connected to radiator plates 33 and 34, and the inductor L and/or the capacitances C are coupled to the radiator plates 33 and 34. The radiator plates 33 and 34 are preferably dipole radiator plates, for example.

Figure 10:
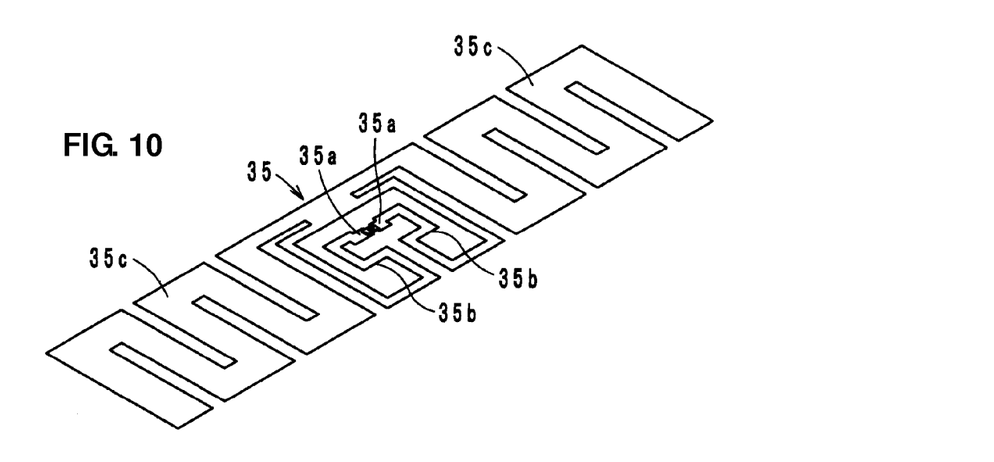
FIG. 10 is a perspective view showing a wireless IC device according to another preferred embodiment of the present invention.
Figure 11:
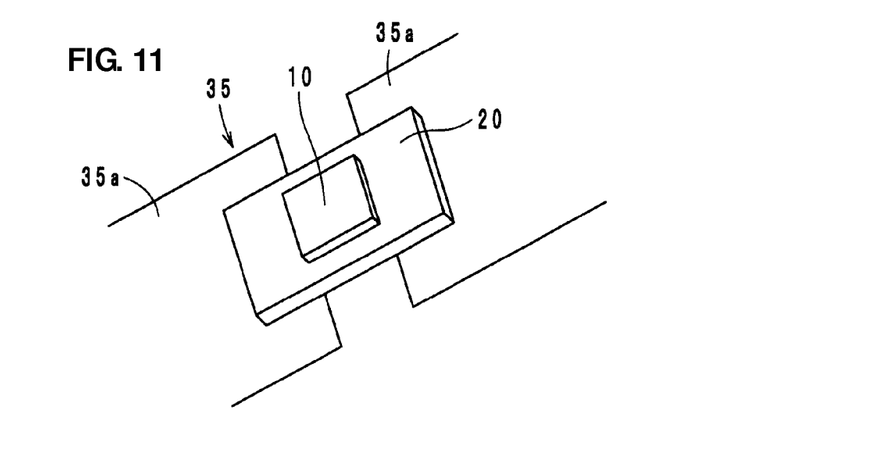
FIG. 11 is a perspective view showing a relevant portion of the wireless IC device shown in FIG. 10.

In another preferred embodiment of the present invention, as shown in FIGS. 10 and 11, the board 20 (20A, 20B, 20C) including the wireless IC chip 10 disposed thereon is preferably connected to a radiator plate 35. The radiator plate 35 is coupled at a pair of end portions 35a thereof to the inductor L and/or the capacitances C. The radiator plate 35 preferably includes loop electrodes 35b each including an end portion 35a, and meandering-shaped dipole electrodes 35c each coupled to the loop electrode 35b.

In the wireless IC devices shown in FIGS. 9 and 10, electrostatic breakdown of the wireless IC chip 10 is effectively prevented. In addition, when the inductor L is electrically connected to a pair of the end portions of the radiator plates 33 and 34 or 35, even if a potential difference occurs between both of the end portions of the radiator plates 33 and 34 or 35, a closed loop is provided by the board 20, and thus, insulation breakdown does not occur. Further, the gain of the dipole radiation plates is improved.

Moreover, by setting a resonant frequency defined by the loop electrodes 35b and the inductor L and/or the capacitances C, so as to substantially correspond to a frequency of a high-frequency signal used in RFID, communication with a reader/writer is possible regardless of the size and the shape of the radiator plate 35. In addition, by adjusting the inductance value of the inductor L and the capacitance value irrespective of the shapes of the loop electrodes 35b, the resonant frequency can be set to be a predetermined frequency.

When a resonant frequency is determined by the inductor L and the loop electrodes, the impedance ($X_L$) of the inductor L in the UHF band is greater than the impedance ($X_C$) of the capacitance produced between the input and output terminal electrodes of the wireless IC, a resonant point is set on a lower frequency side of a necessary band, and the inductor L is coupled to the loop electrodes, thereby obtaining a predetermined resonant point. Thus, a resonant point can be obtained in the necessary band merely by changing the board 20. For the resonant frequency, it is only necessary to decrease the inductance value of the inductor L if the inductance value of the loop electrodes is high, and it is only necessary to increase the inductance value of the inductor L if the inductance value of the loop electrodes is low. In addition, when a resonant frequency is determined by the capacitances C and the loop electrodes, it is only necessary to set a resonant point on a higher frequency side of the necessary band.

Note that the high-frequency device and the wireless IC device according to preferred embodiments of the present invention are not limited to the above-mentioned preferred embodiments, and can be modified in a variety of ways within the scope of the present invention.

As described above, preferred embodiments of the present invention are useful for a high-frequency device and a wireless IC device which are used in an RFID system, and in particular, are advantageous in that insulation breakdown is effectively prevented and the reliability is effectively enhanced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency device comprising:
   a wireless IC;
   a radiator plate; and
   a board coupled to the wireless IC and electrically connected to the radiator plate; wherein
   a static electricity countermeasure element is provided in the board;
   the static electricity countermeasure element includes an inductor connected in parallel between the wireless IC and the radiator plate; and
   an impedance of the inductor at a frequency of static electricity is less than an impedance of the wireless IC.

2. The high-frequency device according to claim 1, wherein the static electricity countermeasure element includes a capacitance connected in series between the wireless IC and the radiator plate.

3. The high-frequency device according to claim 2, wherein
   the wireless IC includes two coupling portions coupled to the board; and
   the static electricity countermeasure element includes two capacitances connected in series between the two coupling portions and the radiator plate, the two capacitances having the same or substantially the same capacitance value.

4. The high-frequency device according to claim 1, wherein the board includes a plurality of electrode layers.

5. The high-frequency device according to claim 4, wherein the plurality of electrode layers overlap each other in a plan view.

6. The high-frequency device according to claim 1, wherein the board is made of a flexible material.

7. A wireless IC device comprising:
   a wireless IC;
   a radiator plate; and
   a board coupled to the wireless IC and electrically connected to the radiator plate; wherein
   a static electricity countermeasure element is provided in the board;
   the static electricity countermeasure element includes an inductor connected in parallel between the wireless IC and the radiator plate; and
   an impedance of the inductor at a frequency of static electricity is less than an impedance of the wireless IC.

8. The wireless IC device according to claim 7, wherein the static electricity countermeasure element includes a capacitance connected in series between the wireless IC and the radiator plate.

9. The wireless IC device according to claim 8, wherein
   the wireless IC includes two coupling portions coupled to the board; and
   the static electricity countermeasure element includes two capacitances connected in series between the two coupling portions and the radiator plate, the two capacitances having the same or substantially the same capacitance value.

10. The wireless IC device according to claim 8, wherein
    the radiator plate includes, at least at a pair of end portions thereof, loop electrodes coupled to the static electricity countermeasure element; and
    a resonant frequency defined by the loop electrodes and the capacitance substantially corresponds to a frequency of a high-frequency signal used in RFID.

11. The wireless IC device according to claim 7, wherein
    the radiator plate includes, at least at a pair of end portions thereof, loop electrodes coupled to the static electricity countermeasure element; and
    a resonant frequency defined by the loop electrodes and the inductor substantially corresponds to a frequency of a high-frequency signal used in RFID.

12. A wireless IC device comprising:
    a wireless IC;
    a radiator plate; and
    a board coupled to the wireless IC and electrically connected to the radiator plate; wherein
    a static electricity countermeasure element is provided in the board; and
    the radiator plate includes, at least at a pair of end portions, loop electrodes coupled to the static electricity countermeasure element.

13. A wireless IC device comprising:
    a wireless IC;
    a radiator plate; and
    a board coupled to the wireless IC and electrically connected to the radiator plate; wherein
    a static electricity countermeasure element is provided in the board; and
    the radiator plate includes, at least at a pair of end portions thereof, loop electrodes coupled to the static electricity countermeasure element, and dipole electrodes coupled to the loop electrodes.

* * * * *